United States Patent [19]

Szasz et al.

[11] 4,181,214

[45] Jan. 1, 1980

[54] WAFER TRANSFER APPARATUS

[75] Inventors: Peter R. Szasz, Menlo Park; Harvey L. Schulte, Los Altos, both of Calif.

[73] Assignee: Kasper Instruments, Inc., Sunnyvale, Calif.

[21] Appl. No.: 854,688

[22] Filed: Nov. 25, 1977

[51] Int. Cl.² .............................................. B65G 37/00
[52] U.S. Cl. .................................. 198/467; 198/470; 198/471; 198/597; 198/810
[58] Field of Search ............... 198/340, 470, 469, 468, 198/465, 466, 467, 471, 809, 597, 601, 631, 356, 437, 810, 339, 347; 214/1 R

[56] References Cited

U.S. PATENT DOCUMENTS

| | | | |
|---|---|---|---|
| 3,490,573 | 1/1970 | Pierson et al. | 198/471 X |
| 3,552,942 | 8/1970 | Hedd | 198/469 X |
| 4,027,246 | 5/1977 | Calloma et al. | 198/339 |

Primary Examiner—Robert B. Reeves
Assistant Examiner—Douglas D. Watts
Attorney, Agent, or Firm—Roland I. Griffin

[57] ABSTRACT

An apparatus is provided for transferring semiconductor wafers from one conveying or transport mechanism to another in a manner that substantially reduces wafer damage. The apparatus comprises first and second sensors; first, second and third rollers; a motor with a drive shaft coupled to the first and second rollers for applying a rotational force thereto; and a pneumatic unit coupled to a movable platform on which the rollers are mounted and operable for applying a lifting force to or removing a lifting force from the movable platform. The rollers are mounted parallel to and coplanar with each other and are positionable above or below the belts of a two-belt conveyor mechanism, the first roller being disposed for vertical movement between the belts of the conveyor mechanism, and the second and third rollers being coupled by two belts forming a transport mechanism for transporting wafers to or from the conveyor mechanism. In response to detection of a passing wafer on the conveyor mechanism by the first sensor, the pneumatic unit applies a lifting force to the movable platform, thereby causing the first and second rollers to lift the passing wafer from the conveyor mechanism, and the motor rotates the first, second and third rollers counterclockwise, thereby causing the lifted wafer to be transported from the conveyor mechanism onto the transport mechanism. The transport mechanism also operates in the lifted position to transport wafers to the conveyor mechanism when the motor rotates the first, second and third rollers clockwise. In response to detection by the second sensor of a wafer passing on the transport mechanism towards the conveyor mechanism, the pneumatic unit removes the lifting force from the movable platform, thereby lowering it and causing the first and second rollers to deposit the wafer onto the conveyor mechanism. These transfers of wafers to and from the conveyor mechanism are performed without interference with the operation of the conveyor mechanism and without damage to the wafers.

10 Claims, 5 Drawing Figures

WAFER TRANSFER APPARATUS

BACKGROUND OF THE INVENTION

This invention relates to automatic transport (conveyor) apparatus in general, and to semiconductor wafer transport apparatus in particular.

Many transport systems provide for automatic transfer of fragile items such as semiconductor wafers from one location to another along prescribed paths or channels. To reduce the likelihood of damage to such fragile items during transportation, many systems utilize an air bearing principle to provide automatic transportation (non-human handling) of the items. Two such systems are described, for example, in the articles entitled "Touchless Wafer Handling" by Donald P. Baumann, Solid State Technology, March, 1973, pages 45–49, and "Precision Wafer Orientation and Transfer System" by R. R. Jorgensen and H. A. Klein, IBM Technical Disclosure Bulletin, Vol. 16, No. 9, February, 1974, pages 2910 and 2911. To facilitate the guiding of wafers along a prescribed path and the stopping of wafers at selected positions, fixed side guards and fixed stops are often employed as described, for example, in the articles entitled "Plastic Film Side Guides for Semiconductor Wafer Conveyor" and "Wafer Stop," both by A. Mack and R. Rio, at pages 2907 and 2906, respectively, of the above-mentioned IBM Technical Disclosure Bulletin.

Not infrequently the buffeting of wafers against side guards and collision of wafers with fixed stops cause damage to the edges of the wafers. Consequently those damaged wafers may be rejected from use in the production of transistors and integrated circuits (IC's). What would be desirable, therefore, is an apparatus that would obviate the need for elaborate air-bearing mechanisms and the need for boundary members such as side guards and fixed stops, and that would be capable of transferring wafers from point to point automatically (e.g., from a conveyor line to a processing station) with minimal or no damage to the wafers.

SUMMARY OF THE INVENTION

Thus, in accordance with the illustrated preferred embodiment of the present invention, an improved wafer transfer apparatus is provided for transferring semiconductor wafers from one conveying (transport) means to another in a manner that substantially reduces wafer damage. The apparatus comprises a motor with a drive shaft; a pneumatic unit including a solenoid valve coupled to cylinders with actuatable plungers; first and second sensors; and first, second and third roller shafts, the roller shafts being mounted parallel to and coplanar with each other on a movable platform coupled to the actuable plungers. The first and second roller shafts are belt-coupled to the drive shaft and disposed proximate to a pair of conveyor belts, the second roller shaft also being belt-coupled to the third roller shaft to form a transport mechanism. Wafers are conveyed on the conveyor belts in a manner such that the edges and selected positions on the undersides of the wafers are exposed. The roller shafts are positionable above or below the conveyor belts, with the first roller shaft being disposed for vertical movement between the conveyor belts. In response to detection of a passing wafer on the conveyor belts by the first sensor, the pneumatic unit operates to raise the roller shafts by applying a lifting force to the movable platform via the actuatable plungers thereby, causing the first and second roller shafts to lift the detected wafer from the conveyor belts without interfering with the operation of the conveyor belts and without damage to the wafer, and the motor operates to impart a counterclockwise rotational force to the roller shafts, thereby transporting the lifted wafer away from the conveyor belts via the transport means. The transport mechanism also operates in a raised position to transport wafers to the conveyor belts when the motor rotates the first, second and third rollers clockwise. In response to detection by the second sensor a wafer passing on the transport mechanism towards the conveyor belts and onto the first roller shaft, the pneumatic unit operates to remove the lifting force from the movable platform and to thereby lower the roller shafts causing the wafer to be deposited onto the conveyor belts without interference with the operation of the conveyor belts and without damage to the wafer.

DESCRIPTION OF THE PREFERRED EMBODIMENT

Figure 1:
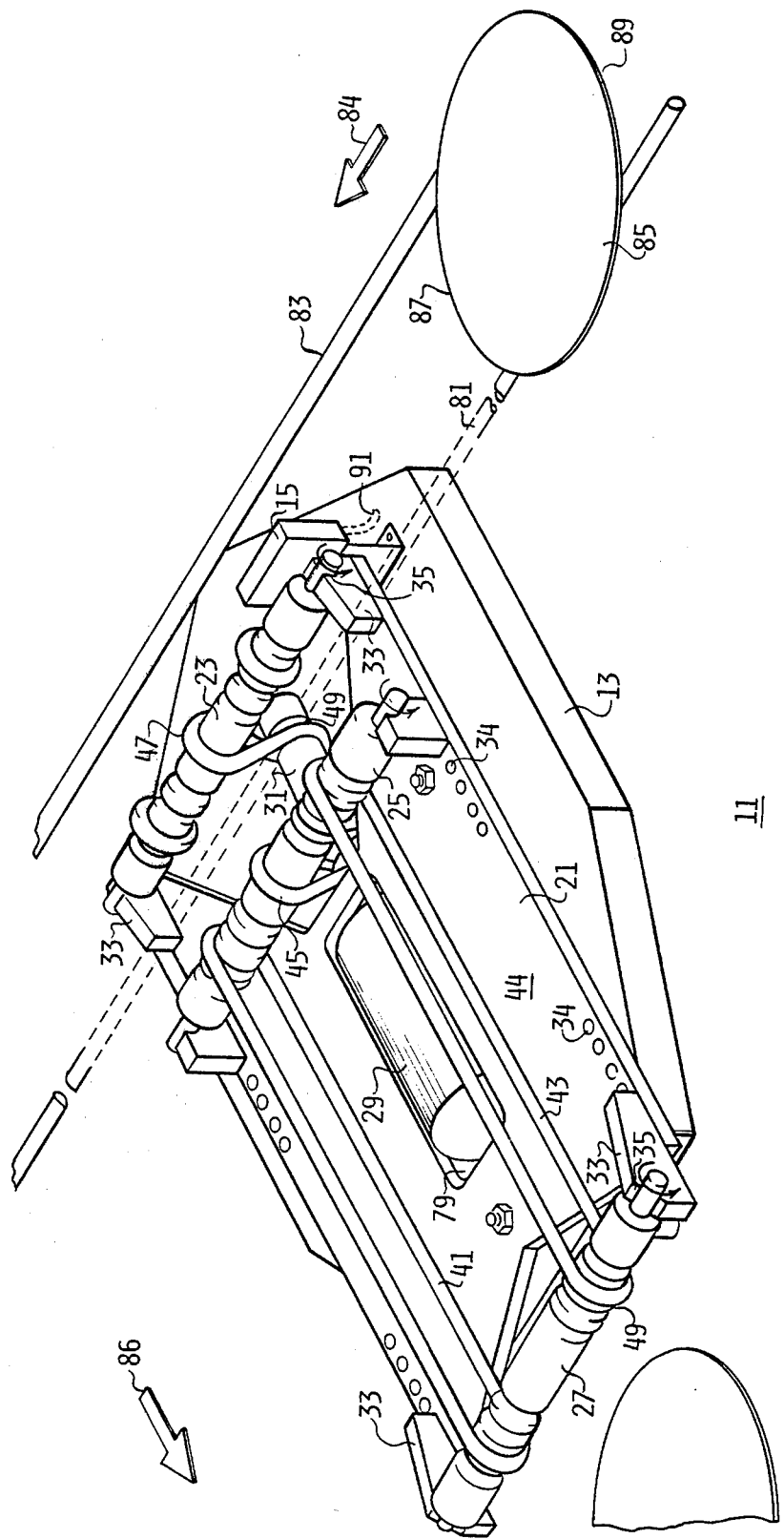
FIG. 1 is a partial cut-away perspective view of a wafer transfer apparatus according to the preferred embodiment of the present invention showing a first sensor.
Figure 2:
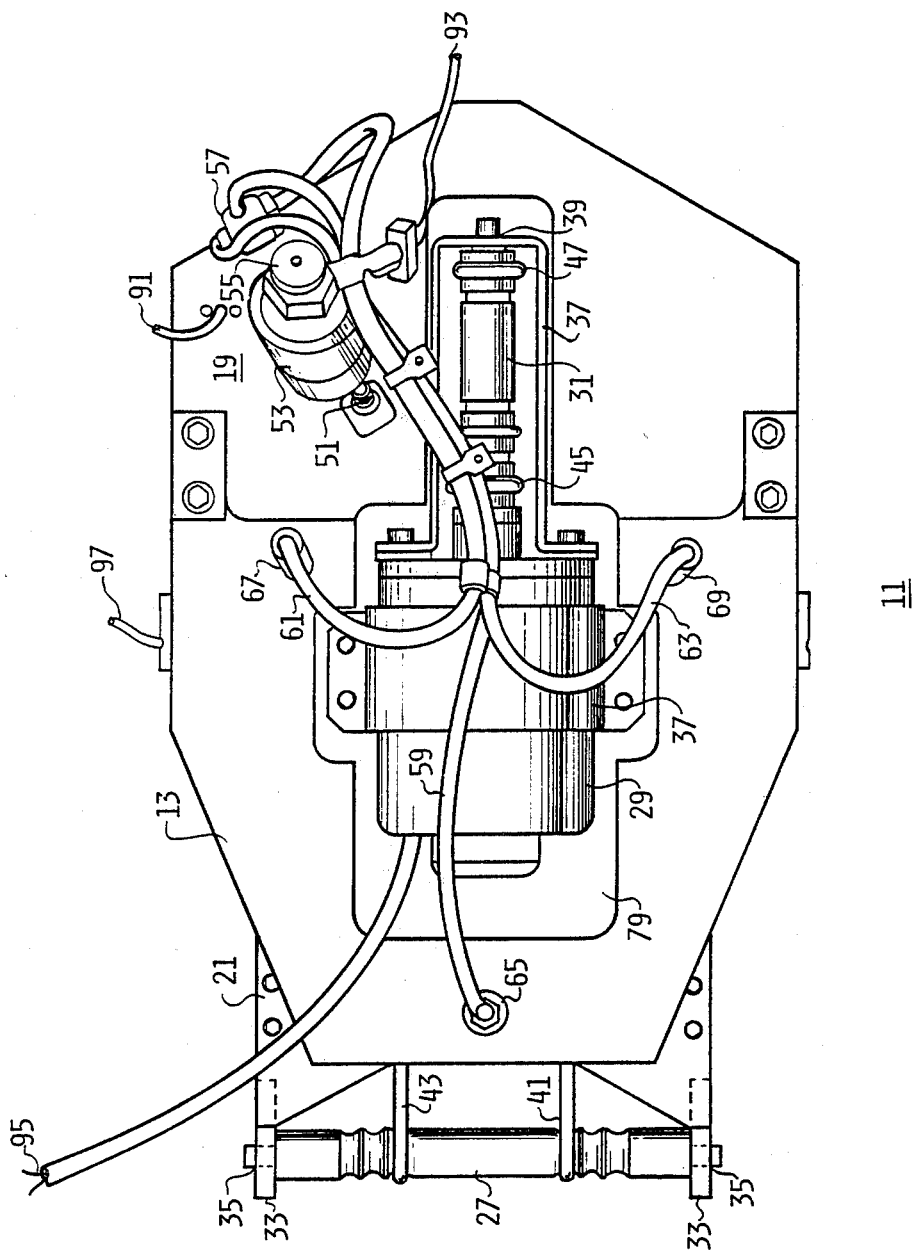
FIG. 2 is a bottom view of the apparatus of FIG. 1.

Referring to FIGS. 1–4, there is shown a wafer transfer apparatus 11 having a fixed (non-movable) platform 13 upon which are mounted first and second photoelectric sensors 15, 17 (FIG. 4), a pneumatic unit 19 (FIG. 2), and a vertically movable platform 21. Mounted on the vertically movable platform 21 are first, second and third grooved roller shafts 23, 25, 27; a motor 29; and a grooved drive shaft 31, one end of the drive shaft being coupled to motor 29. Also mounted on the movable platform 21 are support braces 33 with slots 35 formed therein for supporting the ends of the roller shafts, and a support bracket 37 with a hole 39 formed therein for supporting the other end of drive shaft 31 which extends therethrough and for affixing (a cradling manner) motor 29 to platform 21. The roller shafts 23, 25, 27 are mounted parallel to and coplanar with each other and are disposed for rotational movement within the slots 35. Second and third roller shafts 25 and 27 are coupled to each other by belts 41 and 43 forming a transport mechanism 44. Also, second roller shaft 25 is coupled to drive shaft 31 by a belt 45. First roller shaft 23 is similarly coupled to drive shaft 31 by a belt 47. Grooves 49 formed in the roller and drive shafts serve to receive the belts 41, 43, 45, 47.

Figure 3:
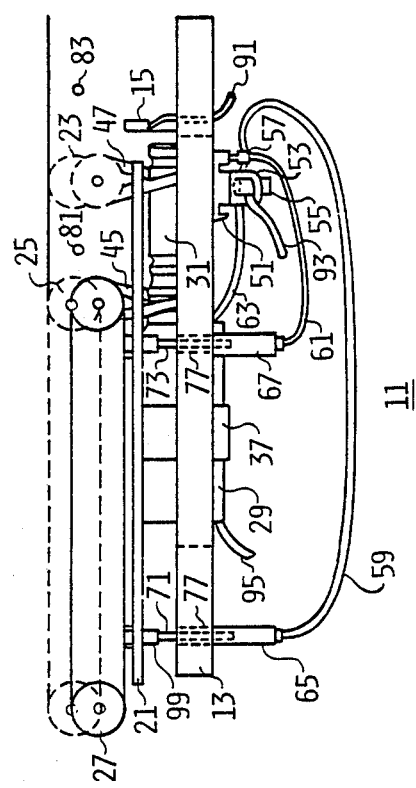
FIG. 3 is a side view of the apparatus of FIG. 1.

Pneumatic unit 19 (FIG. 2) includes an air inlet 51 for receiving pressurized air from a pressurized air source (not shown), a three-way solenoid valve 53 with a vent 55, an outlet needle-valve 57, and actuatable cylinders 65, 67, 69, the outlet needle-valve 57 being coupled to the cylinders by pneumatic cables 59, 61, 63. Pressurized air from inlet 51 is applied to the cylinders 65, 67, 69 via the cables 59, 61, 63. As shown in FIG. 3, each cylinder contains a plunger or vertically extendable rod 71 or 73. The rods extend from the cylinders through holes 77 formed in fixed platform 13 and are affixed to the underside of movable platform 21, thereby supporting platform 21. Fixed platform 13 also has an aperture 79 defined therein (FIG. 2) to permit vertical movement of motor 29 and shaft 31 therethrough when movable platform 21 is raised or lowered by rods 71, 73.

Conveyor belts 81 and 83 of FIG. 1 represent a conveyor mechanism as used in a production line. In response to the conveyor mechanism being energized and set into motion, for example (by and under control of a processor or controller) in the direction of arrow 84, belts 81 and 83 transport a wafer 85 over and past first photoelectric sensor 15 of the transfer apparatus 11. Transported thus on belts 81 and 83, without the use of side guides or the like, the wafer travels from station to station without damage to its edge. As indicated in FIGS. 1–3 and 5, upon sensing or detecting the trailing edge 89 of wafer 85, sensor 15 transmits a signal to the processor via conductive lead 91, and the processor responds with a pair of signals, one of which is applied to conductive lead 93 of the solenoid valve 53 to activate the solenoid valve, and the other of which is applied to conductive lead 95 of motor 29 to activate the motor. In response to the activating signal applied to it, motor 29 turns drive shaft 31 causing roller shafts 23, 25 and 27 to rotate counterclockwise. In response to the activating signal applied to it, solenoid valve 53 opens, allowing pressurized air from inlet 51 to pass through the solenoid valve and through the outlet needle-valve 57 into cylinders 65, 67, 69 via cables 59, 61 and 63. At the cylinders, the applied air pressure pushes plungers 71, 73 up causing platform 21 to rise. As platform 21 rises, first and second roller shafts 23 and 25 engage, while rotating, the underside of wafer 85, thereby lifting the wafer from conveyor belts 81, 83 and advancing the wafer onto the moving belts 41 and 43 of transport mechanism 44. Transferred thus from belts 81, 83 to belts 41 43, the wafer 85 may be advanced via belts 41 and 43 to a desired station for processing, as indicated by arrow 86 in FIG. 1.

Figure 4:
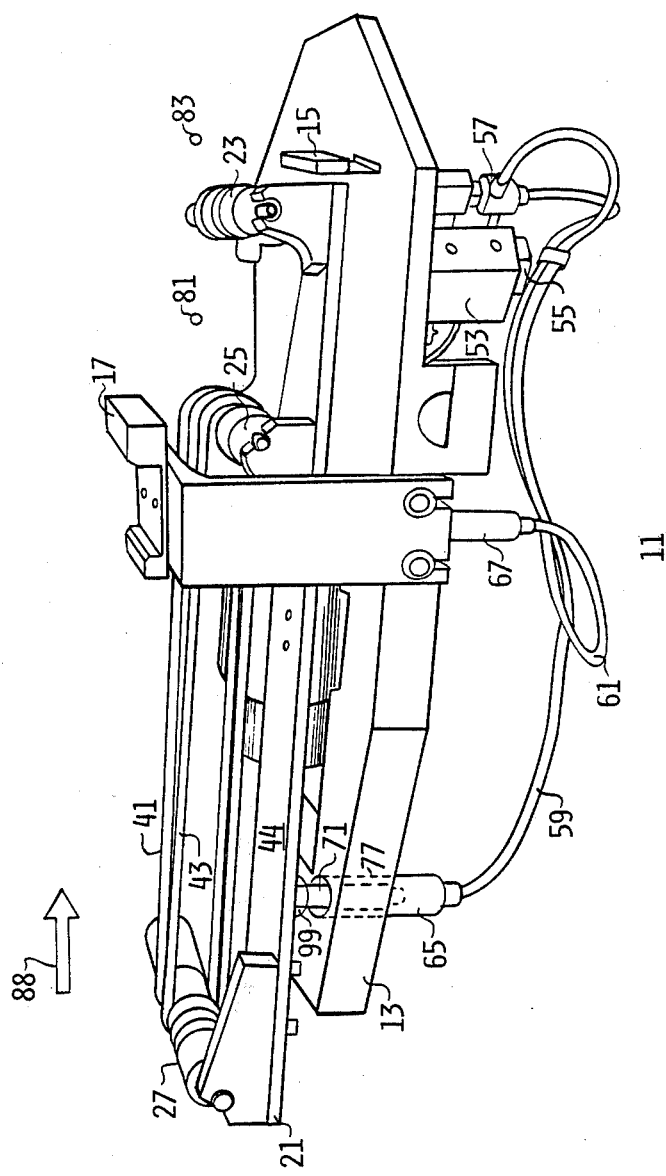
FIG. 4 is a partially cut-away perspective view of the apparatus of FIG. 1 showing a second sensor.
Figure 5:
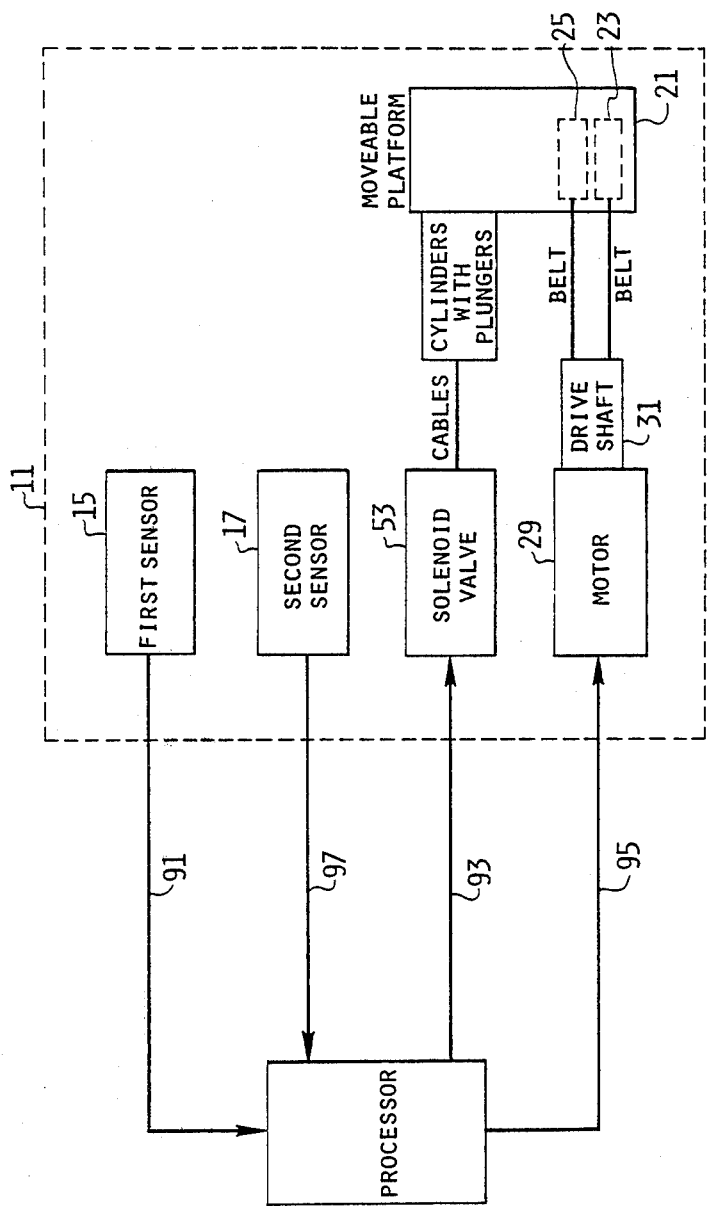
FIG. 5 is a block diagram of the apparatus of FIG. 1 in cooperation with a processor or controller.

FIG. 4 illustrates how a wafer is returned to the conveyor mechanism represented by belts 81, 83 via belts 41, 43 of transport mechanism 44. In preparation for the return of a wafer to the conveyor mechanism, motor 29 and solenoid valve 53 of pneumatic unit 19 are activated by the processor (by applying appropriate signals to leads 93 and 95 as described hereinabove), thereby raising platform 21 and causing roller shafts 23, 25 and 27 to rotate clockwise. Thereafter, whenever a wafer 85 is introduced onto belts 41 and 43 of transport mechanism 44, it is made to travel under and past second photoelectric sensor 17 (in the direction indicated by arrow 88) and onto roller shafts 25 and 23. As the trailing edge of the wafer is sensed by sensor 17, indicating that the wafer is positioned over conveyor belts 81 and 83, sensor 17 transmits a signal to the processor via conductive lead 97, and the processor responds by applying a signal to motor 29 via lead 95 and a signal to solenoid valve 53 of pneumatic unit 19 via lead 93. The signal applied to solenoid valve 53 deactivates solenoid valve 53 causing air in the pneumatic unit 19 to escape via vent 55 thereby allowing platform 21 to drop down (i.e., lower itself through the action of gravity) so that the bottom of a stop member 99 (FIGS. 3 and 4) comes to rest upon the top surface of fixed platform 13. This causes roller shafts 23 and 25 to deposit wafer 85 onto conveyor belts 81 and 83. The signal applied to motor 29 deactivates or turns off the motor, causing the rotation of roller shafts 23, 25, 27 and the movement of belts 41 and 43 to stop.

In an optional embodiment of the present invention, the sensors 15 and 17 may be made to sense the leading edge 87 of a passing wafer and to send appropriate signals to the processor causing it to slow down the conveyor belts 81, 83 in preparation for the transfer of a wafer from or to the conveyor belts. To accommodate wafers of different sizes (diameters), the belts 41 and 43 are adjustable and can be moved to other grooves of the roller shafts 25 and 27. Also the roller shaft supports (e.g., braces 33) are movable to different locations on platform 21 as indicated by the holes 34 (FIG. 1).

We claim:

1. An apparatus having a transport means for performing one of the functions of transferring items from a conveyor means to the transport means and transferring items from the transport means to the conveyor means, the conveyor means having at least two parallel conveyor belts spatially disposed for conveying said items by engaging selected portions of the underside of each item, leaving other portions of the underside exposed, the apparatus comprising:

first sensor means disposed proximate to the conveyor belts for detecting a passing item thereon without contacting the item;

second sensor means disposed proximate to the transport means for detecting a passing item thereon without contacting the item;

pneumatic means disposed for providing a lifting force in response to detection of a passing item by the first sensor means, and for removing a previously provided lifting force in response to detection of a passing item by the second sensor means;

motor means having a drive shaft disposed for providing a rotational force in response to one of detection of a passing item by the first sensor means and introduction of an item onto the transport means; and at least three roller means coupled to the pneumatic means, each roller means being disposed to rotate about a different axis, the axes being spaced a selected distance from each other and parallel to and coplanar with each other, at least two but not all of the roller means being coupled to the drive shaft of the motor means and disposed proximate to the conveyor belts for transferring an item therefrom to the transport means and for transferring an item from the transport means to the conveyor belts, and remaining roller means being disposed to one side of the roller means coupled to the drive shaft of the motor means and being belt-coupled to the nearest of those roller means to form the transport means for transporting items transferred thereonto;

whereby an item is transferred from the conveyor belts to the transport means by raising the roller means relative to the conveyor belts to engage selected portions of the exposed underside of the item and lift the engaged item from the conveyor belts in response to the lifting force, and by rotating the roller means in one sense to move the lifted item onto the transport means in response to the rotational force, and whereby an item is transferred from the transport means to the conveyor belts by rotating the roller means in an opposite sense to move the item to a position above the conveyor belts in response to the rotational force, and by lowering the roller means relative to the conveyor belts to deposit the item on the conveyor belts with the conveyor belts engaging selected portions of the exposed underside of the item in response to removal of the lifting force, the transferring operations being performed without interference by the roller means with the operation of the conveyor belts.

2. Apparatus for transferring workpieces to and from a conveyor having at least two spaced parallel conveyor belts for conveying workpieces disposed thereon, said apparatus comprising:

transport means for conveying workpieces laterally relative to the conveyor;

first sensor means disposed proximate to the conveyor for detecting a passing workpiece thereon without contacting the workpiece;

second sensor means disposed proximate to the transport means for detecting a passing workpiece thereon without contacting the workpiece;

rotatable means elevatably disposed proximate to the conveyor and coupled to the transport means for transferring workpieces between the conveyor and the transport means;

control means for raising the rotatable means relative to the conveyor to lift a workpiece from the conveyor in response to detection of a workpiece by the first sensor means, and for thereafter lowering the rotatable means relative to the conveyor to deposit a lifted workpiece on the conveyor in response to detection of a workpiece by the second sensor means; and drive means coupled to the rotatable means and the transport means for driving the rotatable means and the transport means in one sense to move a lifted workpiece onto the transport means and laterally away from the conveyor in response to detection of a workpiece by the first sensor means, and for thereafter driving the transport means and the rotatable means in the opposite sense to move a lifted workpiece from the transport means onto the rotatable means above the conveyor.

3. Apparatus as in claim 2 wherein:

said rotatable means includes at least first and second roller shafts coupled to the drive means and disposed for rotation about first and second spaced, parallel, coplanar axes; and said transport means includes at least a third roller shaft coupled to the second roller shaft by at least two spaced, parallel conveyor belts and disposed for rotation about a third axis spaced from, parallel to, and coplanar with the first and second axes.

4. Apparatus as in claim 3 wherein:

said drive means includes a motor having a drive shaft coupled to the first and second roller shafts by first and second drive belts;

said first, second and third roller shafts are rotatably mounted on an elevatable platform; and said control means includes pneumatic means coupled to the elevatable platform for raising the platform relative to the conveyor in response to detection of a workpiece by the first sensor means and for lowering the platform relative to the conveyor in response to detection of a workpiece by the second sensor means.

5. Apparatus as in claim 4 wherein:

said first roller shaft is disposed on one side of one of the conveyor belts of the conveyor between two of those conveyor belts;

said second and third roller shafts are disposed on the opposite side of said one of the conveyor belts along one side of the conveyor; and said first, second and third axes are substantially parallel to the conveyor belts of the conveyor.

6. Apparatus as in claim 5 wherein:

said first sensor means is disposed beneath the conveyor between the conveyor belts thereof; and said second sensor means is disposed above the transport means between the conveyor belts thereof.

7. Apparatus as in claim 6 wherein said control means and said drive means are operated in response to detection of one of the leading and tailing edges of a workpiece by the first and second sensor means.

8. Apparatus as in claim 7 wherein said conveyor is slowed down in response to detection of the other of the leading and trailing edges of a workpiece by the first and second sensor means.

9. Apparatus as in claim 3 wherein:

said first roller shaft is disposed on one side of one of the conveyor belts of the conveyor between two of those conveyor belts;

said second and third roller shafts are disposed on the opposite side of said one of the conveyor belts along one side of the conveyor; and said first, second and third axes are oriented in generally the same direction as the conveyor belts of the conveyor.

10. Apparatus as in claim 9 wherein:

said first sensor means is disposed directly beneath the conveyor proximate to the first roller shaft; and said second sensor means is disposed directly above the transport means proximate to the second roller shaft.

* * * * *

UNITED STATES PATENT AND TRADEMARK OFFICE
CERTIFICATE OF CORRECTION

PATENT NO. : 4,181,214

DATED : January 1, 1980

INVENTOR(S) : Peter R. Szasz et al

It is certified that error appears in the above-identified patent and that said Letters Patent are hereby corrected as shown below:

Column 1, line 26, '"Wafer Stop,"' should read '"Wafer Stop",';

Column 1, line 67, immediately after "plungers" insert a comma;

Column 1, line 68, delete the comma;

Column 2, line 47, immediately before "a" insert "in";

Column 3, line 9, delete the comma and insert a left parenthesis in place thereof, and delete the left parenthesis immediately preceding "by" and insert a comma in place thereof;

Column 3, line 37, immediately after "41" (first occurrence) insert a comma, and delete the comma immediately following "43";

Column 4, line 48, delete "and" and insert "the" in place thereof; and

UNITED STATES PATENT AND TRADEMARK OFFICE
CERTIFICATE OF CORRECTION

PATENT NO. : 4,181,214
DATED : January 1, 1980
INVENTOR(S) : Peter R. Szasz et al.

It is certified that error appears in the above—identified patent and that said Letters Patent is hereby corrected as shown below:

Column 6, line 29, delete "tailing" and insert -- trailing --.

Signed and Sealed this

Tenth Day of June 1980

[SEAL]

Attest:

Attesting Officer

SIDNEY A. DIAMOND

Commissioner of Patents and Trademarks